United States Patent
Zang et al.

(10) Patent No.: US 11,621,336 B2
(45) Date of Patent: Apr. 4, 2023

(54) PYRAMID-SHAPED TRANSISTORS

(71) Applicant: OMNIVISION TECHNOLOGIES, INC., Santa Clara, CA (US)

(72) Inventors: Hui Zang, San Jose, CA (US); Gang Chen, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 85 days.

(21) Appl. No.: 17/326,095

(22) Filed: May 20, 2021

(65) Prior Publication Data

US 2022/0376068 A1 Nov. 24, 2022

(51) Int. Cl.
*H01L 29/423* (2006.01)
*H01L 29/66* (2006.01)
*H01L 27/146* (2006.01)
*H01L 29/78* (2006.01)

(52) U.S. Cl.
CPC .... *H01L 29/4236* (2013.01); *H01L 27/14614* (2013.01); *H01L 27/14643* (2013.01); *H01L 29/66734* (2013.01); *H01L 29/7813* (2013.01)

(58) Field of Classification Search
CPC ......... H01L 27/14614; H01L 27/14643; H01L 29/4236; H01L 29/66734; H01L 29/7813
USPC .......................................................... 257/330
See application file for complete search history.

(56) References Cited

U.S. PATENT DOCUMENTS

| | | | |
|---|---|---|---|
| 7,804,130 B1 * | 9/2010 | Fung | H01L 29/4966 257/330 |
| 8,865,549 B2 | 10/2014 | Lim et al. | |
| 2008/0203472 A1 * | 8/2008 | Tamura | H01L 29/4236 438/270 |
| 2018/0166481 A1 * | 6/2018 | Wei | H01L 29/0653 |
| 2022/0130886 A1 * | 4/2022 | Zang | H01L 27/14643 |

* cited by examiner

*Primary Examiner* — Igwe U Anya
(74) *Attorney, Agent, or Firm* — COJK/OmniVision Technologies, Inc.

(57) ABSTRACT

Transistors include a pyramid-shaped gate trench defined by a triangular shape or a trapezoidal shape in a channel width plane and a trapezoidal shape in a channel length plane. Side wall portions of the pyramid-shaped gate trench form a channel having a triangular shape or a trapezoidal shape in the channel width plane. Advantageously, such transistors increase transconductance without increasing pixel width. Devices, image sensors, and pixels incorporating such transistors are also provided, in addition to methods of manufacturing the same.

20 Claims, 14 Drawing Sheets

PYRAMID-SHAPED TRANSISTORS

BACKGROUND

This disclosure relates generally to image sensors, and in particular but not exclusively, source followers for image sensors, and methods of manufacturing transistors for image sensors.

Image sensors are ubiquitous. They are widely used in digital cameras, cellular phones, security cameras, as well as medical, automobile, and other applications. The technology used to manufacture image sensors has continued to advance at a great pace. For example, the demands of higher resolution and lower power consumption have encouraged the further miniaturization and integration of these devices. These trends have also contributed to increasing pixel counts.

In image sensors, as the pixel count increases, the bitline setting time also increases due to higher bitline loading. To maintain a high frame rate operation, the transconductance (Gm) of the image sensor source follower transistor can be increased by shortening a length of the source follower channel and/or by increasing a width of the source follower channel. Similarly, the Gm of the image sensor row select transistor can be increased by shortening a length of the row select channel and/or by increasing a width of the row select channel. However, shortening the source follower channel length and/or the row select channel length can lead to deleterious effects, for example short channel effects and undesirable noise, e.g., Random Telegraph Signal (RTS). Shortening the channel length is also constrained by limits to pixel size. Widening the source follower channel width and/or the row select channel width can lead to undesirable increases in pixel size.

BRIEF DESCRIPTION OF THE SEVERAL VIEWS OF THE DRAWINGS

Non-limiting and non-exhaustive embodiments of the present disclosure are described with reference to the following figures, wherein like reference numerals refer to like parts throughout the various views unless otherwise specified.

Figure 1:
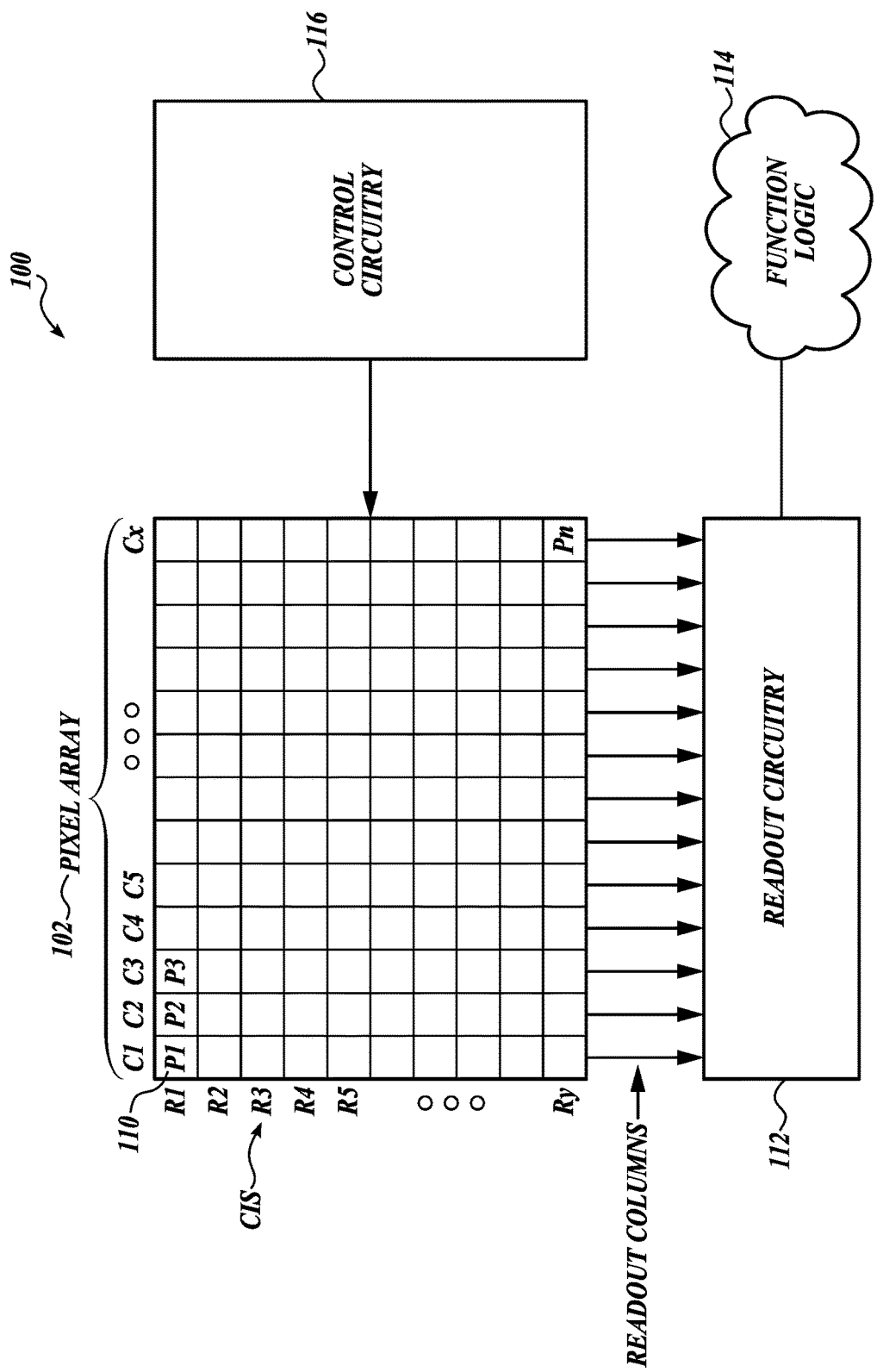
FIG. 1 is a block diagram illustrating an embodiment of an image sensor in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

The present disclosure provides devices, image sensors, pixels, transistors, and methods for manufacturing the same. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "an embodiment" or "some embodiments" means that a particular feature, structure, or characteristic described in connection with the embodiment is included in at least one embodiment of the present invention. Thus, the appearances of the phrases "in some embodiments" or "in an embodiment" throughout this specification are not necessarily all referring to the same example. Furthermore, the particular features, structures, or characteristics of embodiments may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "underneath" can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The present disclosure also provides transistors for image sensors, for example source follower transistors, reset transistors, and row select transistors. To facilitate understanding, the present disclosure describes such transistors in the context of complementary metal-oxide-semiconductor ("CMOS") image sensors. However, it shall be appreciated that the present disclosure shall not be limited to transistors for CMOS image sensors, but may be applied to non-CMOS image sensors. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

In the present disclosure, the terms "semiconductor substrate" or "substrate" refer to any type of substrate used for forming semiconductor devices thereon, including single crystal substrates, semiconductor on insulator (SOI) substrates, doped silicon bulk substrate, and epitaxial film on semiconductor (EPI) substrates and the like. Further, although the various embodiments will be primarily described with respect to materials and processes compatible with silicon-based semiconductor materials (e.g., silicon and alloys of silicon with germanium and/or carbon), the present technology is not limited in this regard. Rather, the various embodiments can be implemented using any types of semiconductor materials.

This disclosure refers to a number of terms with respect to different embodiments (including apparatuses and methods). Terms having alike names have alike meanings with respect to different embodiments, except where expressly noted. Similarly, this disclosure utilizes a number of terms of art. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

The present disclosure provides transistors having non-planar channels in at least one channel width plane and at least one channel length plane, which advantageously increases transconductance without increasing pixel width. Advantageously, the transistors of the present disclosure provide higher operation speed and reduced deleterious effects such as RTS and read noise. Additionally, the transistors of the present disclosure can be fabricated utilizing an efficient process, described below, for greater manufacturing throughput and economy. Additional advantages will become apparent from the following description.

Reference is made herein to a "channel width plane" or a "channel width direction," one the one hand, and a "channel length plane" or a "channel length direction" on the other hand. For clarity, a "channel width plane" is a plane extending across the channel through a semiconductor substrate. In other words, a channel width plane is perpendicular to the direction of charge carrier flow between a source and a drain of a transistor. By comparison, a channel length plane is parallel to the direction of charge carrier flow. Further, "planar channel width" and "effective channel width" are used herein. "Planar channel width" generally corresponds to a linear width of a transistor gate, as measured in a channel width plane. In other words, the planar channel width corresponds to the channel width of a planar channel. By comparison, "effective channel width" generally refers a non-linear measurement of the channel taken in a channel width plane. The transistors of the present disclosure have an effective channel width that exceeds the planar channel width, which advantageously increases Gm without increasing pixel width.

Although the transistor structures are generally described in the context of source followers, the structures are equally applicable to row select transistors, reset transistors, and other image sensor transistors. The present disclosure also provides image sensors and electronic devices equipped with such transistors.

FIG. 1 is a diagram illustrating one example of a representative image sensor 100 with a pixel array 102 of pixels 110. As shown, the pixel array 102 is coupled to a readout circuitry 112 (which is coupled to a function logic 114) and to a control circuitry 116.

Pixel array 102 is a two-dimensional ("2D") array of pixels 110 (e.g., pixels P1, P2 . . . , Pn). In one embodiment, each pixel 110 is a complementary metal-oxide-semiconductor ("CMOS") imaging pixel. Pixel array 102 may be implemented as either a front side illuminated image sensor array, or a backside illuminated image sensor array. In some embodiments, pixels 110 include one or more transistors as described below, including source follower transistors, row select transistors, and reset transistors. As illustrated, the pixels 110 are arranged into rows (e.g., rows R1 to Ry) and columns (e.g., column C1 to Cx) to acquire image data of a person, place, or object, which can then be used to render a 2D image of the person, place, or object.

After a pixel 110 has acquired its image data or image charge, the image data is readout by readout circuitry 112 and transferred to function logic 114. Readout circuitry 112 may include amplification circuitry, e.g., a differential amplifier circuitry, analog-to-digital ("ADC") conversion circuitry, or otherwise. In some embodiments, the readout circuitry 112 may readout a row of image data at a time along readout column lines (illustrated) or may readout the image data using a variety of other techniques (not illustrated), such as a serial readout or a full parallel readout of all pixels simultaneously.

Function logic 114 includes logic and memory for storing the image data or even manipulating the image data by applying post image effects (e.g., crop, rotate, remove red eye, adjust brightness, adjust contrast, or otherwise).

Control circuitry 116 is coupled to pixels 110, and includes logic and memory for controlling operational characteristics of pixels 110. For example, control circuitry 116 may generate a shutter signal for controlling image acquisition. In some embodiments, the shutter signal is a global shutter signal for simultaneously enabling all pixels 110 to simultaneously capture their respective image data during a single acquisition window. In some embodiments, the shutter signal is a rolling shutter signal whereby each row, column, or group of pixel 110 is sequentially enabled during consecutive acquisition windows.

Figure 2A:
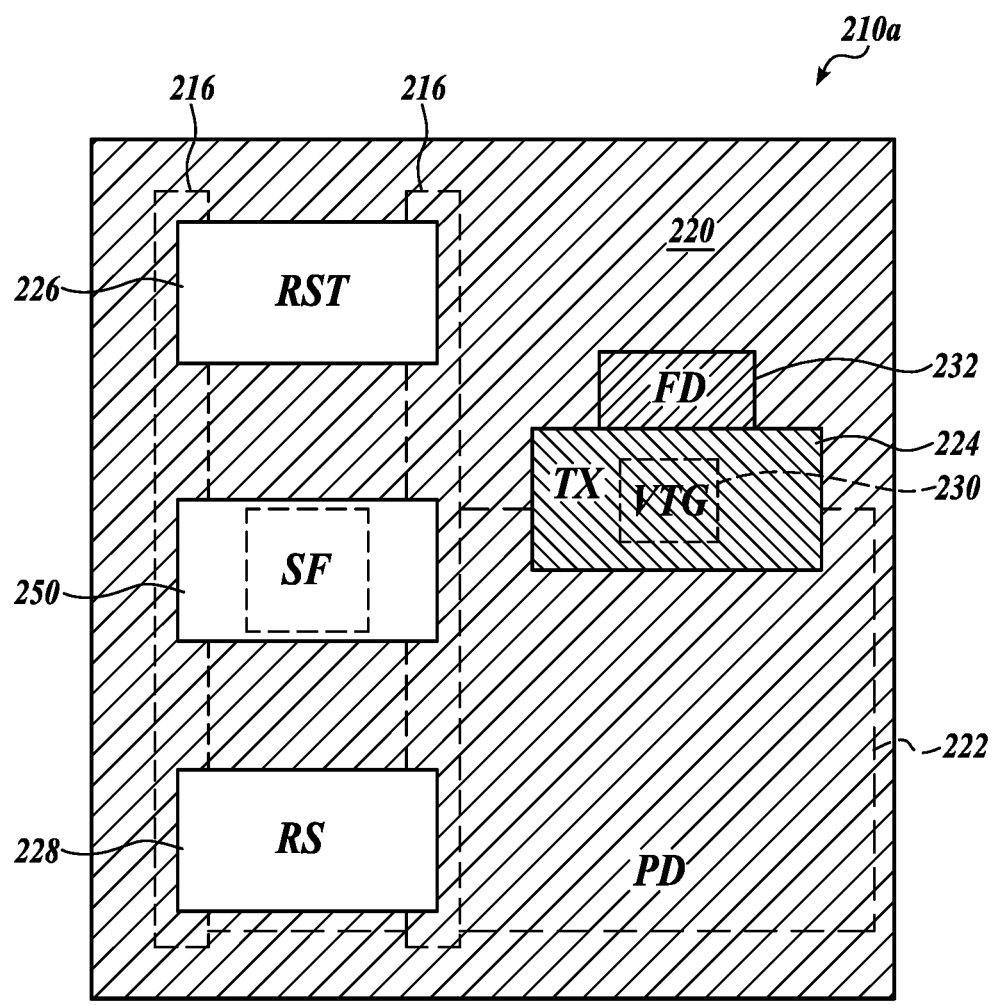
FIG. 2A shows an embodiment of a layout of a pixel in accordance with the teachings of the present disclosure.
Figure 2B:
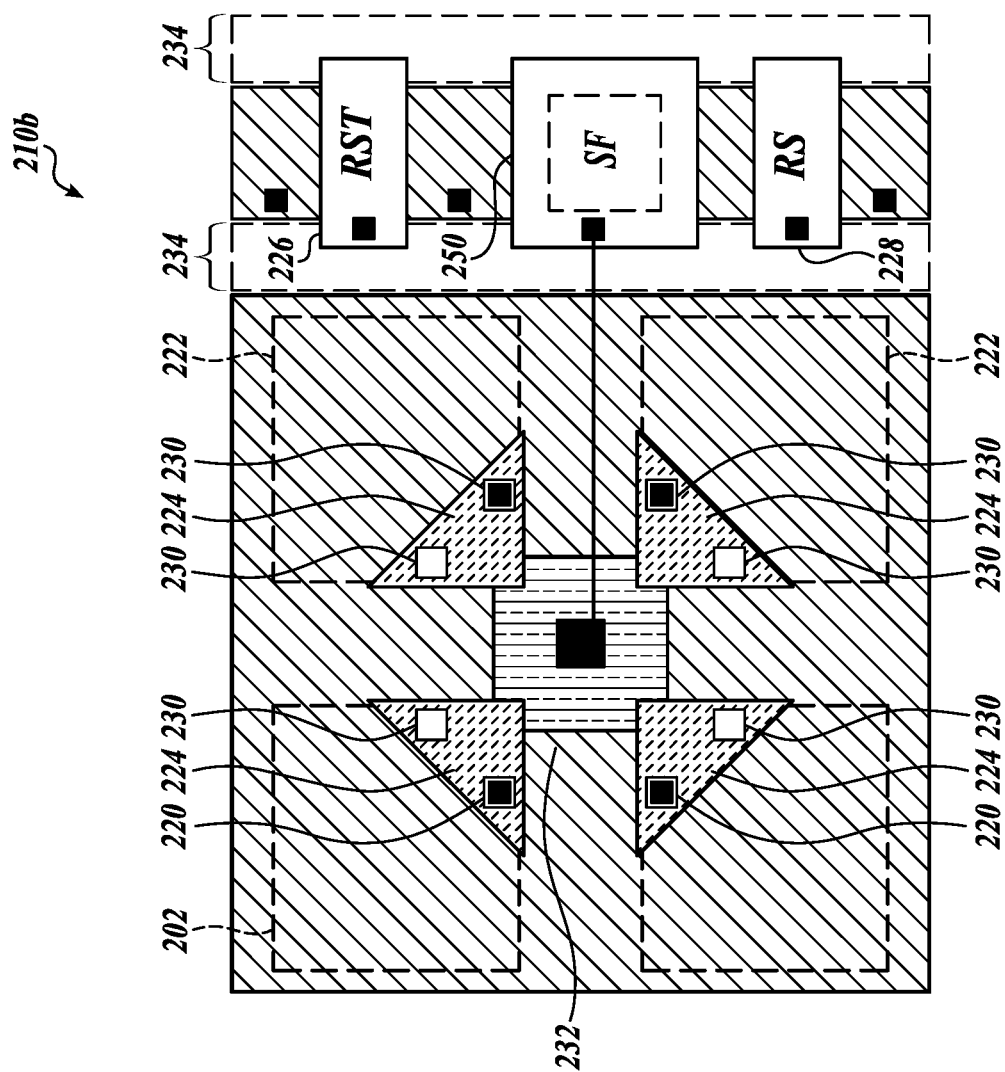
FIG. 2B shows an embodiment of a layout of another pixel in accordance with the teachings of the present disclosure.
Figure 2C:
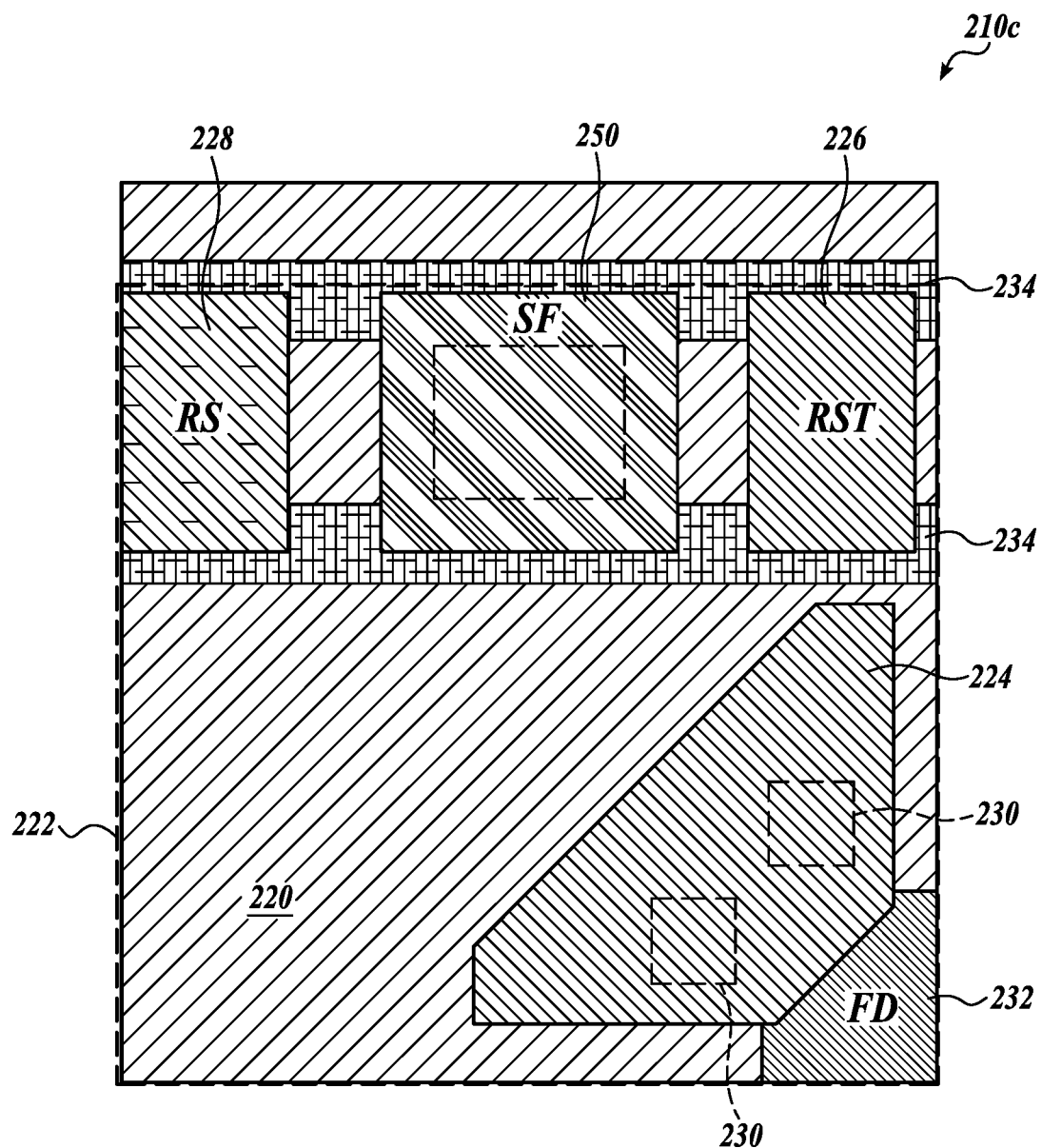
FIG. 2C shows an embodiment of a layout of yet another pixel in accordance with the teachings of the present disclosure.

FIGS. 2A-2C provide representative pixels (such as the pixel 110 of FIG. 1), which incorporate one or more of the transistors described herein. For clarity, the transistors can be utilized in many additional pixel configurations, and are not limited to any particular pixel configuration.

FIG. 2A shows one representative layout of a simplified pixel 210a, which may be utilized in an image sensor such as the image sensor 100 of FIG. 1, which itself may be integrated into an electronic device such as a smart phone.

The pixel layout shown in FIG. 2A is representative, and the teachings of the present disclosure may be embodied in many other pixel layouts, for example the layouts of FIGS. 2B-2C.

Pixel 210a is at least partially formed from a semiconductor substrate 220 having an active pixel area that includes at least one photodiode 222, a floating diffusion 232, a transfer transistor 224, and a device transistor area that includes a reset transistor 226, a row select transistor 228, and a source follower transistor 250.

Photodiode 222 is configured to photogenerate and accumulate charge carriers (e.g., electrons, holes) in response to incoming light received during an integration period of the image sensor. The photogenerated charge carriers accumulated in a charge accumulation region of photodiode 222 (e.g., source of transfer transistor 224), for example during the integration period of an image sensor, can be selectively transferred to the floating diffusion 232 (e.g., drain of transfer transistor 224) depending on voltage applied to the gate of transfer transistor 224. In some embodiments, the photodiodes 222 have a pinned photodiode configuration.

The floating diffusion 232 is coupled to a transfer gate such as a vertical transfer gate 230 and/or a gate of transfer transistor 224, in addition to and a gate of source follower transistor 250. The floating diffusion 232 aggregates charge carriers from photodiodes 222 (via one or more transfer transistors 224) and output a corresponding voltage to the gate of source follower transistor 250 for signal read out.

The vertical transfer gate 230 of the transfer gate forms a conduction channel that transfers charge from the photodiode 222 to floating diffusion 232, which in turn applies a voltage to the gate of source follower transistor 250 based on the amount of charge accumulated in the floating diffusion. The source follower transistor 250 outputs an amplified image signal in response to the voltage received at the gate thereof.

Reset transistor 226 resets (e.g., discharges or charges) coupled photodiode 222 via transfer transistor 224 and the floating diffusion 232 to a preset voltage, e.g., a supply voltage $V_{DD}$, under control of a reset signal received at the gate of reset transistor 226 during a reset period.

Source follower transistor 250 is coupled between a supply voltage $V_{DD}$ and row select transistor 228, and modulates the image signal output based on the voltage received from the floating diffusion 232 at the gate thereof, where the image signal corresponds to the amount photoelectrons accumulated in charge accumulation region of coupled photodiode 222 in response to the amount of incident light absorbed during the integration period at the gate thereof.

Row select transistor 228 selectively couples the output of the source follower transistor 250 (e.g., image signal) to the readout column line under control of a row select signal during read out operation of the image sensor.

The device transistor area is isolated from the active pixel area having transfer transistor 224, photodiode 222, and floating diffusion 232 by channel isolation structures 234 (e.g., shallow channel isolation trench structures or deep channel isolation trench structures), which in some embodiments form part of the transistors described below.

In some embodiments, pixel 210a may include additional elements that are not described in detail herein, such as one or more additional transistors, capacitors, floating diffusions, or the like. In the illustrated example, pixel 210a includes a single photodiode 222; however, some embodiments include a plurality of photodiodes, e.g., sharing a common floating diffusion, a common source follower transistor, a common reset transistor and a common row select transistor. In some embodiments, the pixel 210a includes one photodiode associated with a floating diffusion and pixel transistors such as the source follower transistor, reset transistor, row select transistor, and the like. In some embodiments, the transfer gate of the transfer transistor 224 includes planar transfer gate (instead of vertical transfer gate 230).

In operation, during the integration period of the image sensor (also referred to as an exposure or accumulation period), photodiode 222 absorbs incident light on its charge accumulation region. The photogenerated charge accumulated in the charge accumulation region of the photodiode 222 is indicative of the amount of incident light incident onto its charge accumulation region. After the integration period, a transfer signal (e.g., a positive biasing voltage) applies, for example from the control circuitry 106 of FIG. 1, to the transfer gate of transfer transistor 224 (e.g., vertical transfer gate 230 of transfer transistor 224), which turns on the transfer transistor 224 to transfer the photogenerated charge from coupled photodiode 222 to the floating diffusion during the charge transfer period of the image sensor. The source follower transistor 250 operatively generates the image signal based on voltage output by the coupled floating diffusion 232. The row select transistor 228 coupled to source follower transistor 250 then selectively couples the image signal onto a column bit line upon receiving a row select signal during a readout period for subsequent image processing.

While structures are generally described herein in the context of source follower transistors, the skilled artisan will appreciate that the present disclosure is not limited to source follower transistors. That is, the teachings of the present disclosure apply to other transistors, e.g., row select transistors, reset transistors, and the like.

FIG. 2B shows a layout of another representative pixel 210b, which has similar structure and function as pixel 210a of FIG. 2A except where described below. For example, pixel 210b has a plurality of photodiodes 222, a plurality of transfer transistors 224 that operatively transfer charge from the photodiodes 222 to shared floating diffusions 232. The pixel 210b can be referred to as a "four-shared" pixel, and further includes a reset transistor 226, a source follower transistor 250, and a row select transistor 228 operatively connected to the photodiode 222 via the transfer transistors 224 and floating diffusions 232.

In some embodiments, each transfer transistor 224 employs a transfer gate having vertical transfer gates 230 for selectively transferring photogenerated charges from corresponding photodiodes 222 that is buried in the semiconductor substrate to the shared floating diffusion 232 through a vertical channel. In some embodiments, each transfer transistor 224 employs a planar transfer gate instead of a vertical transfer gate. In some embodiments, a transfer gate of the transfer transistor 224 has a planar gate electrode and a vertical transfer gate electrode (or vertical transfer gate) extending from the planar gate electrode into the semiconductor substrate 220 adjacent to the photodiode 222.

The floating diffusions 232 are each coupled to a gate of the source follower transistor 250, which is coupled between a supply voltage (not shown) and the row select transistor 228.

Reset transistor 226 is coupled between a supply voltage (not shown) and the floating diffusion 232 to reset (e.g., discharge or charge) the floating diffusions to a preset voltage (e.g., a supply voltage $V_{DD}$) under control of a reset signal RST during a reset or pre-charge period. The reset transistor 226 is further coupled to photodiodes 222 through transfer transistors 224 to selectively reset photodiodes 222 to the preset voltage during the reset or pre-charge period.

Source follower transistor 250 modulates the image signal output based on the voltage of floating diffusions 232 received at the gate of the source follower transistor 250, where the image signal corresponds to the amount photoelectrons accumulated in photodiodes 222 during the integration period.

Row select transistor 228 selectively couples the output (e.g., image signal) of source follower transistor 250 to the readout column line under control of a row select signal.

The device transistor area is electrically isolated by channel isolation structures 234 from the active pixel area that includes the photodiodes 222, transfer transistors 224, floating diffusions 232, and other pixel elements.

FIG. 2C shows a layout of yet another representative pixel 210c, which has similar structure and function as the pixels of FIG. 2A and FIG. 2B except where described below. Pixel 210c has a photodiode 222 formed in a semiconductor substrate 220 beneath a device transistor area. Further, the orientation of device transistor area is in a horizontal manner with respect to photodiode 222, in contrast to the device transistor area of FIG. 2A, which is arranged in a vertical arrangement. A transfer transistor 224 having dual vertical transfer gates 230 operatively transfers charge from the photodiode 222 to the floating diffusion 232 through the conduction channel formed by vertical transfer gates 230. The device transistor area is isolated by channel isolation structures 234 from the photodiode 222 and transfer transistor 224 formed in the active pixel area.

Thus, the skilled artisan will appreciate that the transistors described herein can be utilized in any of the pixels described above, and in many additional pixel configurations, and are not limited to any particular pixel configuration.

Figure 3A:
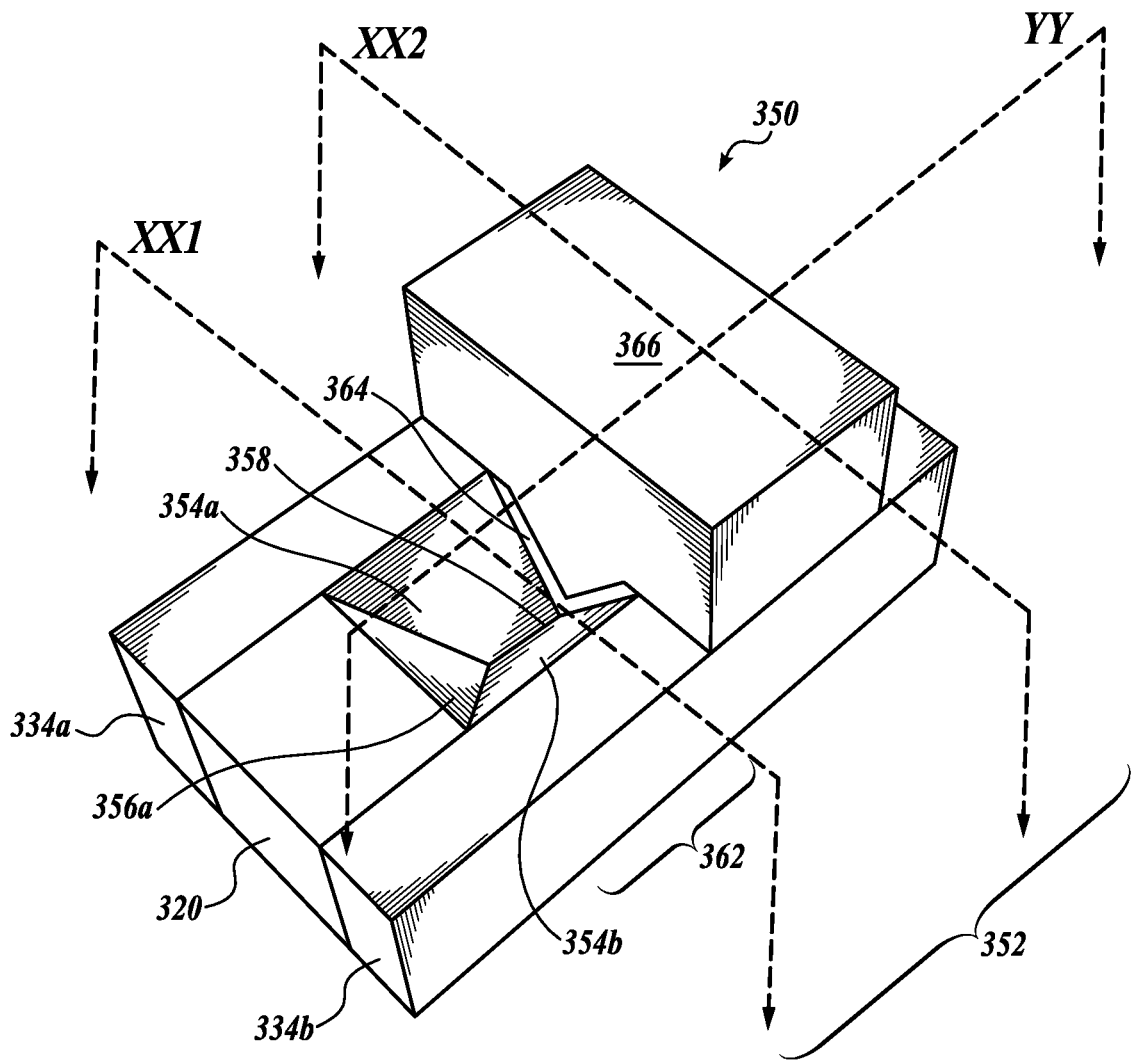
FIG. 3A shows an upper front right perspective view of one embodiment of a source follower transistor in accordance with the teachings of the present disclosure.
Figure 3B:
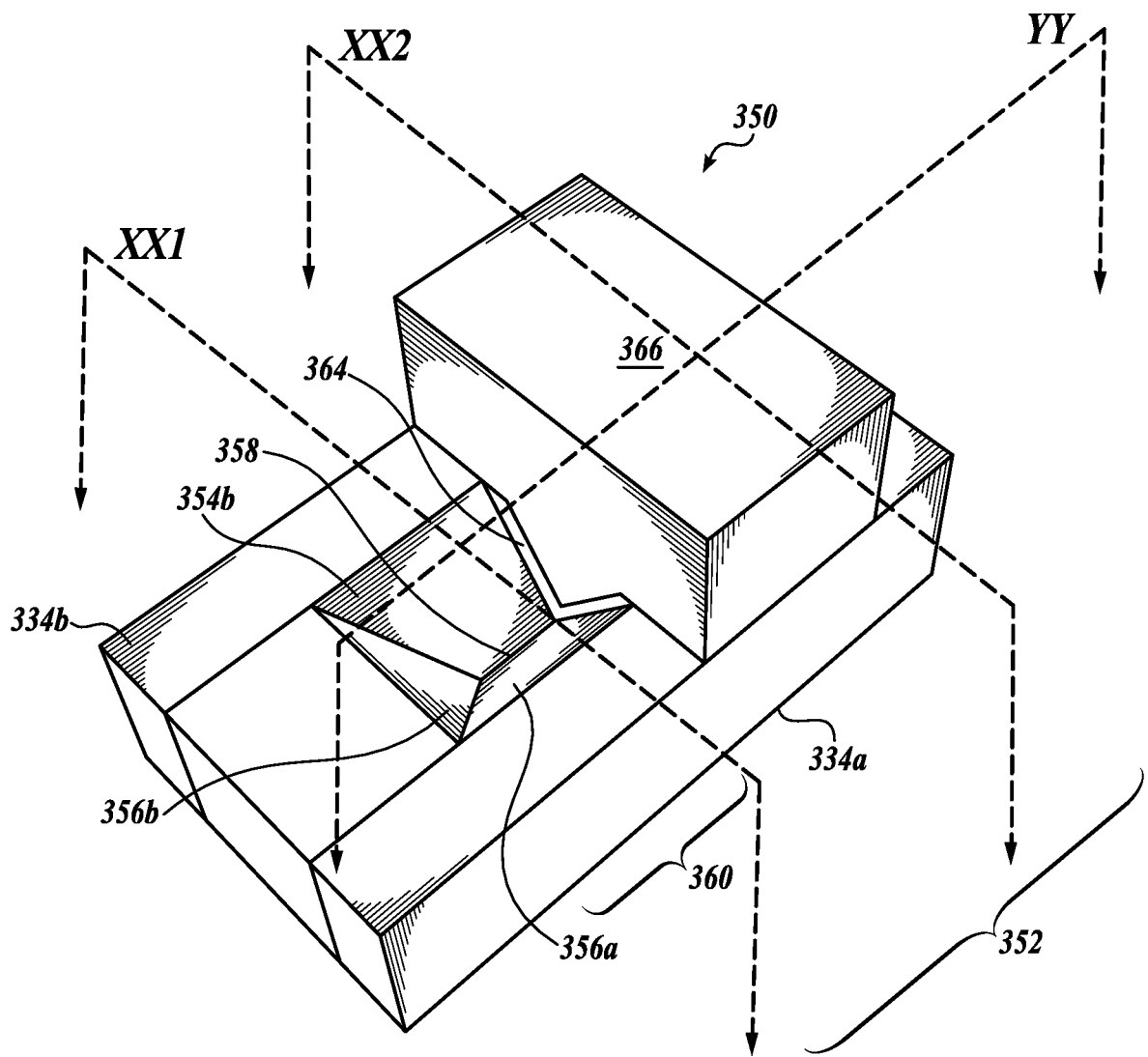
FIG. 3B shows an upper rear left perspective view of the source follower transistor of FIG. 3A.

FIG. 3A and FIG. 3B show opposing perspective views of the topography of one representative source follower transistor 350, in accordance with an embodiment of the present disclosure. The source follower transistor 350 is analogous to the source follower transistor 250 of FIG. 2A-2C, and accordingly may be utilized in any pixel layout described and contemplated herein, which in turn may be utilized in an image sensor such as described in FIG. 1. While innovative transistor structures are described below in the context of a source follower transistor, a skilled artisan will appreciate that such innovative structures apply to other transistors as well, e.g., row select transistors, reset transistors, and the like.

Source follower transistor 350 is formed in a semiconductor substrate 320, for example a single crystal substrate, a semiconductor on insulator (SOI) substrate, a doped silicon bulk substrate, an epitaxial film on semiconductor (EPI) substrate, and the like.

A pyramid-shaped gate trench 352 (i.e., recessed area) is formed in a doped portion of the semiconductor substrate 320, e.g., a P-type well of semiconductor substrate 320 doped with a (first) substrate dopant having a first conductive type such as boron. The pyramid-shaped gate trench 352 is defined by sidewalls which converge at a ridge and together form a V-shape in the channel width planes XX1, XX2, and XX3 (alternatively, when the top surface of the semiconductor substrate 320 is included, a triangular shape). The pyramid-shaped trench 352 is further defined by end walls which each form an obtuse angle with respect to opposite ends the ridge. Thus, the end walls and the ridge together form an outwardly-bowed three-sided shape in the channel length plane YY (alternatively, when the top surface of the semiconductor substrate 320 is included, a trapezoidal shape). In some embodiments, the gate trench 352 has a triangular shape in the channel width plane and a second, different, trapezoidal shape in the channel length plane. This pyramid shape includes a plurality of sloping side wall portions 354a, b and a plurality of sloping end wall portions 356a, b which come to a downward-pointing ridge 358. In the embodiment shown, the ridge 358 is formed as a single line extending in the channel length direction.

The relative dimensions, proportions, and angles of the side wall portions, end wall portions, and ridge of the pyramid-shaped gate trench 352 are representative, not limiting. For example, in some embodiments, the gate trench has a trapezoidal shape in both the channel width direction and the channel length direction. In such embodiments, the downward-pointing ridge 358 is formed as a plane (e.g., a plateau) rather than a line (i.e., having a lower planar surface connecting the two sloping side wall portion). Some embodiments include a plurality of downward-pointing ridges, each extending along the channel length direction. These variations are representative, not limiting.

A source 360 and a drain 362 are respectively formed as doped portions of the semiconductor substrate 320 doped with a (second) source/drain dopant having a second conductive type (different from the first conductive type of the substrate dopant), e.g., a strong N-type dopant such as phosphorous. In particular, the source 360 and drain 362 are respectively formed in a source end and a drain end of the gate trench 352. That is, each of the source 360 and drain 362 are formed underneath part of the ridge 358 of the gate trench 352, and underneath one of the end wall portions (356b and 356a, respectively), and underneath a portion of both side wall portions 354a, b. In particular, source 360 is formed underneath the gate trench 352 and along a portion of side wall portion 354a, b and end wall portion 356a. Likewise, drain 362 is formed underneath the gate trench 352 and along a portion of side wall portions 354a, b and end wall portion 356b. Accordingly, the source 360 and drain 362 each have a shape that conforms to the gate trench 352. Given that both the source 360 and drain 362 are aligned along the ridge 358, both are aligned by the gate trench 352, and thus aligned with each other.

Thus, in the illustrated embodiment, the source 360, a gate 366, and drain 362 cooperate as part of an N-type transistor, i.e., source follower transistor 350. Because the source 360 and drain 362 are formed underneath the pyramid-shaped gate trench 352, and in particular underneath the side wall portions 354a, b, two parallel channel regions are formed in the semiconductor substrate 320. These parallel channel regions transfer charge carriers when sufficient supply voltage $V_{DD}$ is applied to the gate 366, thus increase operational speed of the source follower transistor 350.

An isolation layer 364 is disposed in the gate trench 352 between the source 360 and the drain 362, and extends onto a surface (e.g., front surface) of the semiconductor substrate 320. The gate 366 is disposed on the isolation layer 364 and extends into the gate trench 352 between the source 360 and drain 362. Accordingly, the isolation layer 364 functions as a gate isolation layer, and comprises a dielectric material, such as an oxide or high-K material, e.g., a material having a dielectric constant greater than about 3.9 (e.g., $Al_2O_3$ or $HfO_2$). The gate 366 comprises a polysilicon or a metal material.

Optional channel isolation structures 334a, b (e.g., channel isolation trench structures) are formed in the semiconductor substrate 320, electrically isolating the source follower transistor 350 (e.g., source 360, drain 362) from other elements of the pixel in which it resides, for example a photodiode, floating diffusion, transfer transistor, and the like disposed in the active pixel area. In this embodiment, channel isolation structures 334a, b are shallow channel isolation trench structures filled with an oxide material. However, in some embodiments, junction isolation structures (e.g., p-type isolation wells) are formed in place of channel isolation structures 334a, b. In the illustrated embodiment, each channel isolation structure has a lower end (i.e., opposite from the gate 366) that extends deeper into the semiconductor substrate 320 than the gate trench 352 with respect to a front side of semiconductor substrate 320.

As a result of the foregoing structure, portions of the source follower transistor 350 form two parallel channels alongside wall portions 354a, b of the gate trench 352 through which charge (e.g., electrons) flows between the source 360 and drain 362.

As described below, the pyramid-shaped gate trench 352, together with the shape-conformal source 360 and drain 362, create a channel having an effective channel width that exceeds the comparable planar channel width. This creates a number of advantages, including higher Gm for faster operation speed (read speed) without increased pixel width, reduced RTS and other deleterious effects, and economical fabrication.

FIG. 4A-4D show cross sections of a representative portion of a pixel 410 embodying a transistor similar to that shown in FIGS. 3A-3B. Pixel 410 is similar to the pixel 210a of FIG. 2A, and is representative, not limiting. The transistors can be utilized in many additional pixel configurations. Image sensors (e.g., the image sensor 100 of FIG. 1) and/or pixels (e.g., the pixel 210a-c of FIGS. 2A-2C) may include the illustrated portion of pixel 410.

Figure 4A:
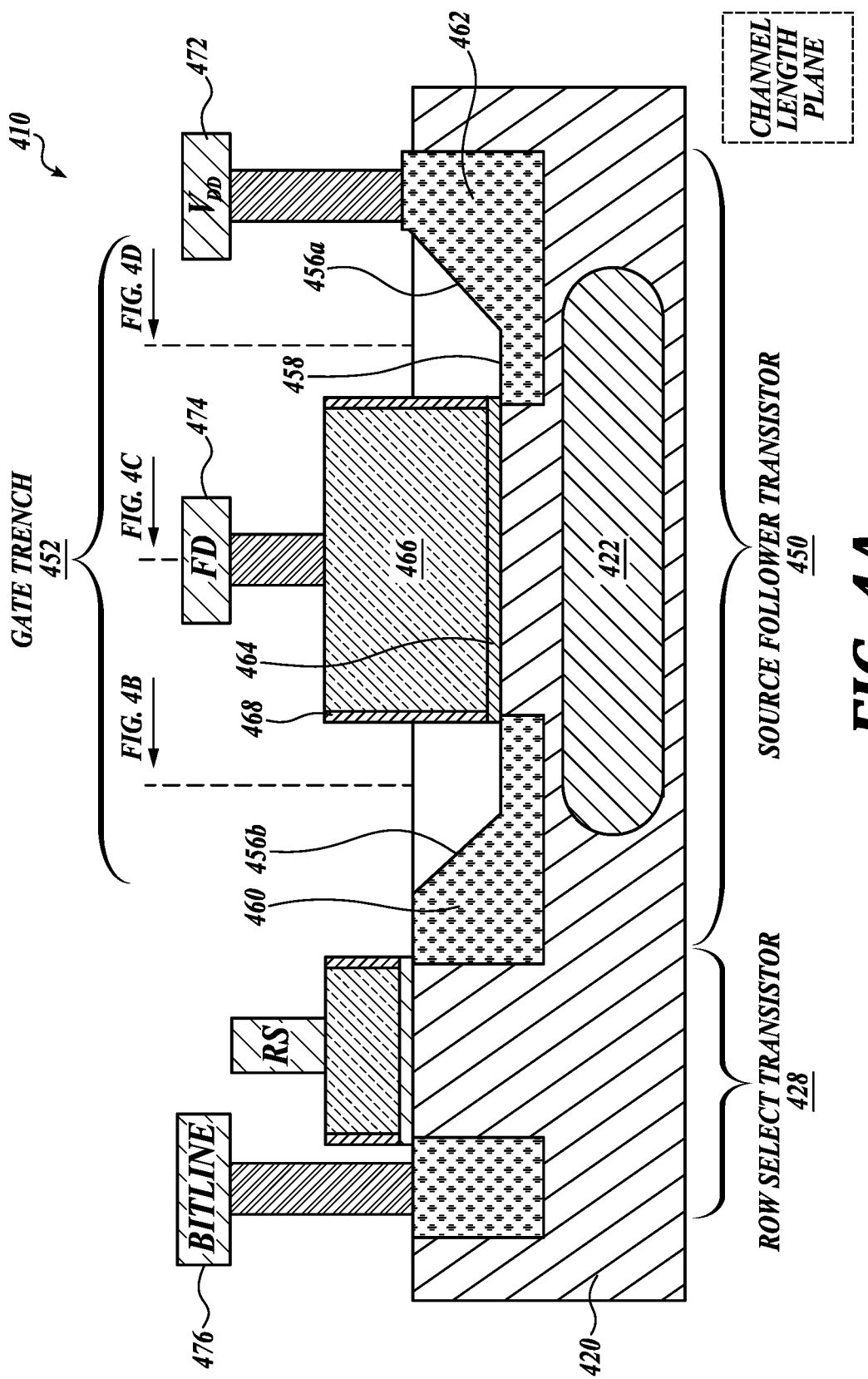
FIG. 4A shows a first cross section of one embodiment of a pixel in accordance with the teachings of the present disclosure.
Figure 4B:
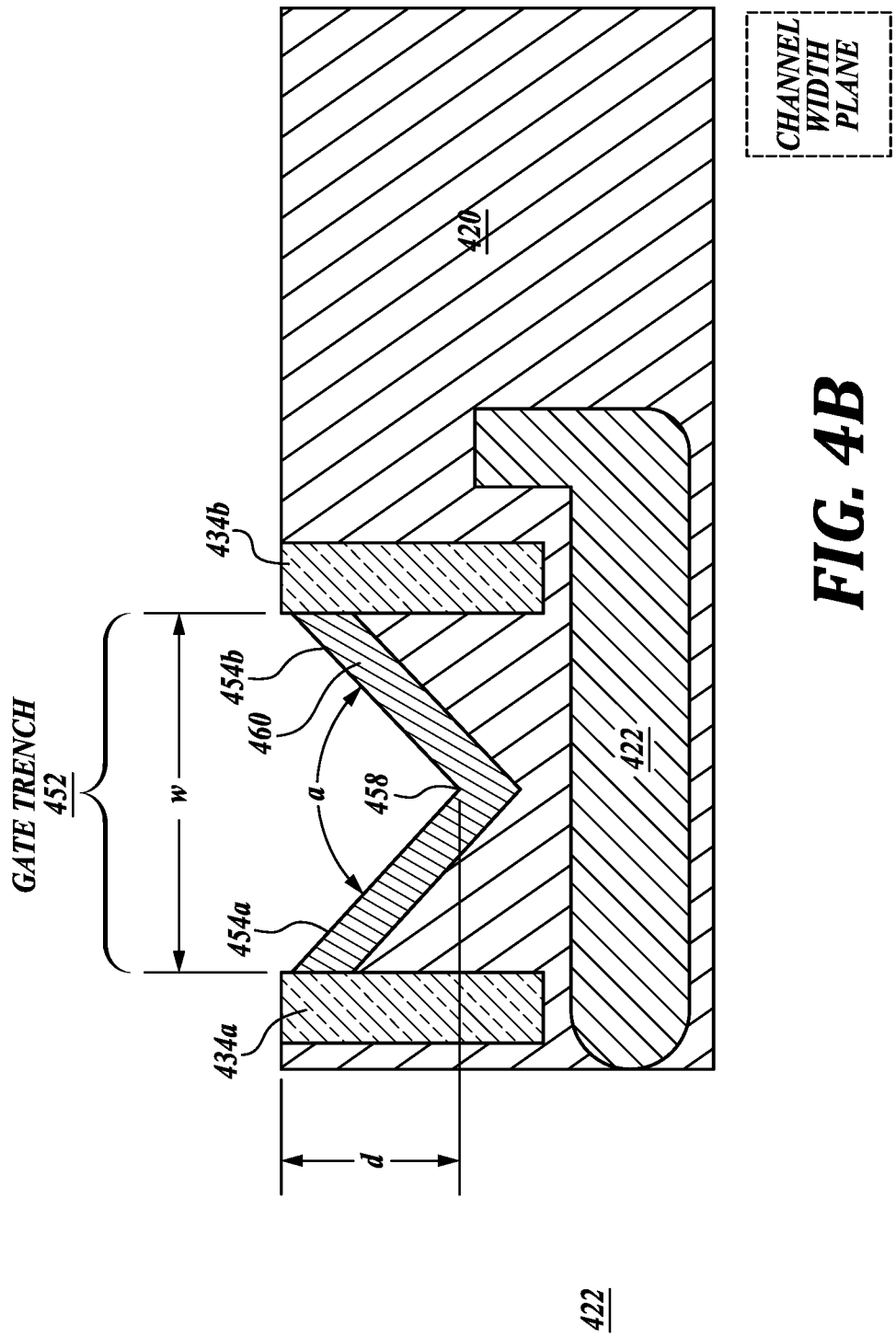
FIG. 4B shows a second cross section of the pixel of FIG. 4A.
Figure 4C:
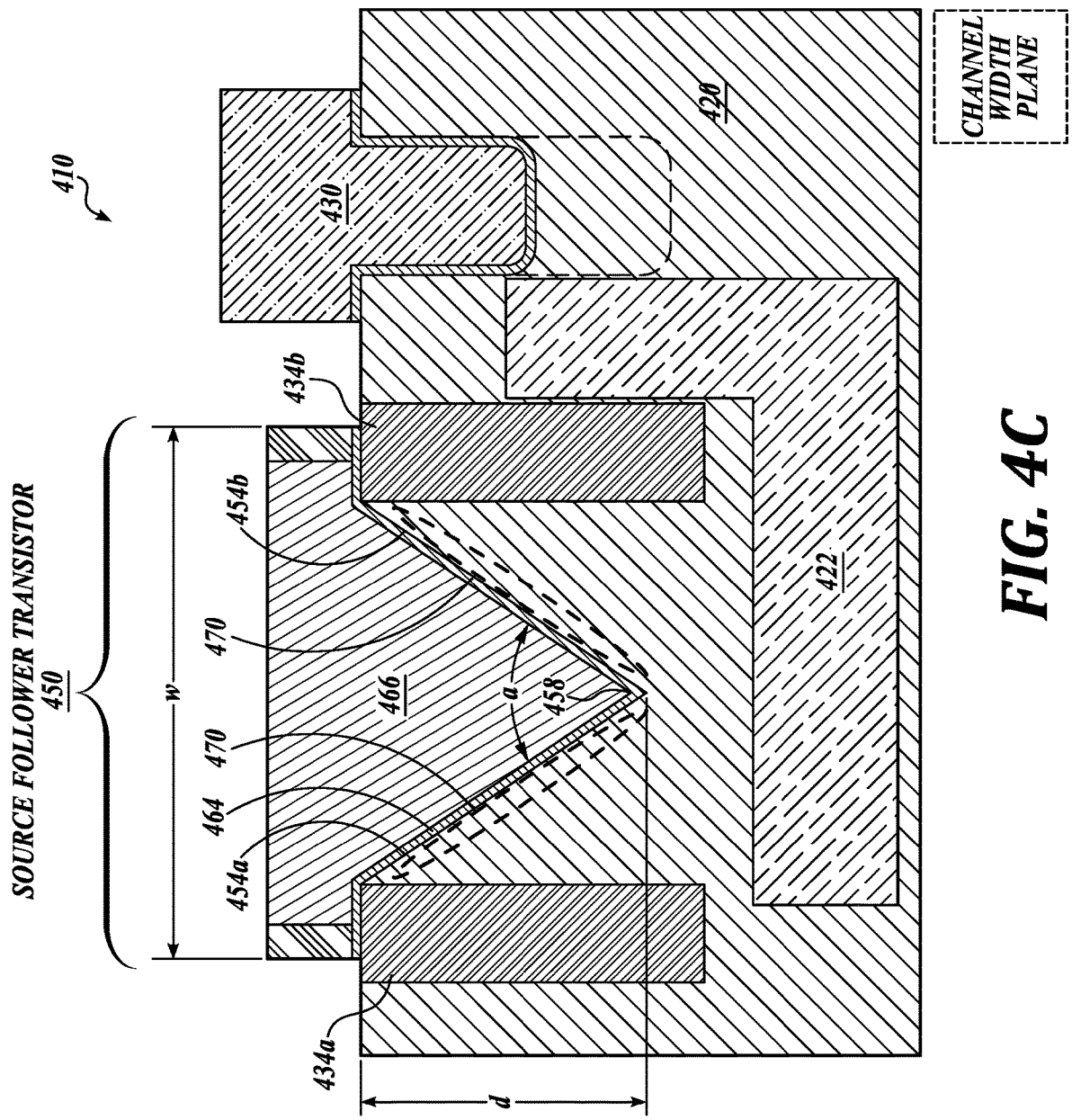
FIG. 4C shows a third cross section of the pixel of FIG. 4A.
Figure 4D:
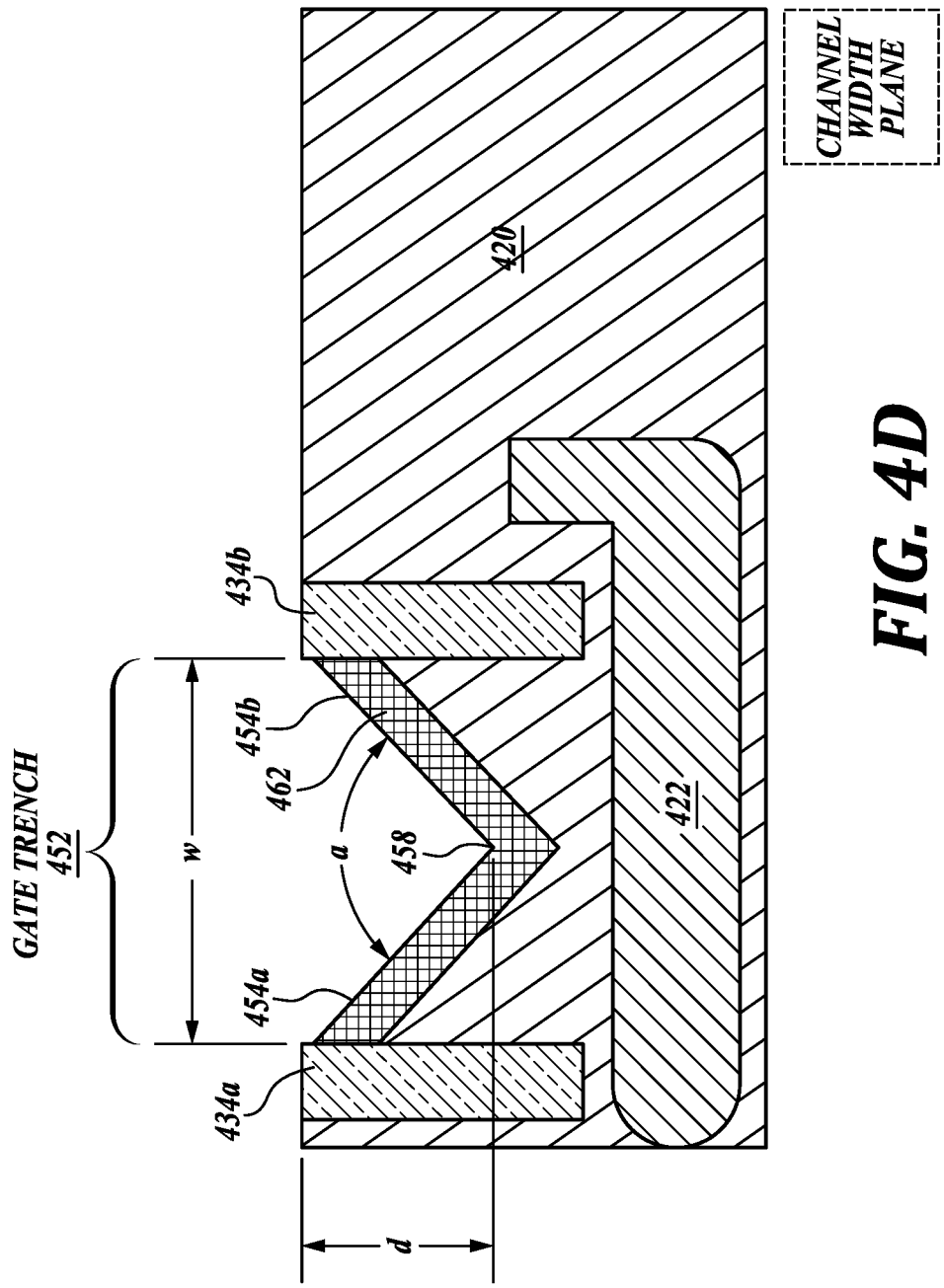
FIG. 4D shows a fourth cross section of the pixel of FIG. 4A.

To facilitate understanding of the topography of the pixel 410, FIG. 4A is taken along a section analogous to section YY of FIG. 3A (i.e., along a channel length direction). FIG. 4B is taken along a section analogous to section XX3 of FIG. 3B (i.e., in a channel width direction through the source). FIG. 4C is taken along a section analogous to section XX2 of FIG. 3A (i.e., in a channel width direction through the gate). FIG. 4D is taken along a section analogous to section XX1 of FIG. 3A (i.e., in a channel width direction through the drain).

As shown in FIG. 4A-4D, pixel 410 includes a semiconductor substrate 420 having a photodiode 422 formed therein beneath a device transistor area that includes a row select transistor 428 operably coupled with a source follower transistor 450, which is similar to source follower transistor 350 of FIGS. 3A-3B and described in greater detail below.

Photodiode 422 absorbs incident light on its charge accumulation region. The photogenerated charge accumulated in the charge accumulation region of the photodiode 422 is indicative of the amount of incident light incident thereon. After the integration period, a transfer transistor 424 having a transfer gate with vertical transfer gate 430 adjacent to the photodiode 422 (see FIG. 4C) transfers the photogenerated charge from coupled photodiode 422 upon receiving a transfer signal (e.g., a positive biasing voltage), to the coupled floating diffusion for subsequent signal read out.

Referring back to FIG. 4A, source follower transistor 450 and row select transistor 428 are operatively coupled by a positive supply voltage, a floating diffusion, and a ground via corresponding contacts 472, 474, 476. In embodiments having a different selection and/or arrangement of transistors, the pixel may have additional, fewer, and/or different voltage sources.

Referring now to FIG. 4B, optional channel isolation structures 434a, b (in this embodiment, trench structures) isolate the device transistor area from the photodiode 422 and other elements of the pixel 410, e.g., the transfer transistor 424 and floating diffusion disposed in the active pixel area. In this embodiment, channel isolation structures 434a, b are shallow channel isolation trench structures formed from an oxide material, e.g., a trench structure filled with oxide material. In the illustrated embodiment, each channel isolation structure 434a, b has a lower end that extends closer to the photodiode 422 than the gate trench 452, in order to isolate the device transistor area. Restated, in some embodiments, each channel isolation structure 434 a, b extends into the semiconductor substrate 420 to a first depth that is deeper than the gate trench 452, which extends a second, shallower depth into the semiconductor substrate 420. Nevertheless, in some embodiments, the channel isolation structures 434 a, b and the gate trench 452 have a common depth in the semiconductor substrate 420.

Referring again to FIG. 4A, source follower transistor 450 has a pyramid-shaped gate trench 452 (described below) and includes a source 460 and drain 462 formed in the semiconductor substrate 420 underneath gate trench 452 of source follower transistor 450. In particular, the source 460 and drain 462 are formed in alike (first) source/drain doped portions of the pyramid-shaped gate trench 452. In this embodiment, source/drain doped portions are heavily doped with an N-type source/drain dopant, such as phosphorous, forming source 460 and drain 462. In some embodiments, source 460 and drain 462 may be formed of N+ doped regions. Given the P-type doping of the semiconductor substrate 420, the source/drain doped portions form an NPN junction in the illustrated embodiment.

Referring to FIG. 4C, an isolation layer 464 formed of a dielectric material (e.g., an oxide or high-K material) is disposed on the second doped portion of the semiconductor substrate 420 between source 460 and drain 462. A gate 466 formed of a polysilicon, metal, or similar gate material is disposed on the isolation layer 464 between the source 460 and drain 462. Thus, the isolation layer 464 is a gate isolation layer and the gate 466, the isolation layer 464, source 460, and drain 462 together form a transistor. As shown, in some embodiments, vertical transfer gate 430 has a shallower depth than the gate trench 452. However, in some embodiments, the vertical transfer gate 430 and the gate trench 452 have a common depth (see dashed extension of vertical transfer gate 430 in FIG. 4C).

An optional spacer 468 is formed around the gate 466, e.g., in a configuration that improves current and voltage parameters of the source follower transistor 450. In some embodiments, the spacer 468 surrounds the gate 466. In some embodiments, spacer 468 is formed of a dielectric material similar to the isolation layer 464. In some embodiments, spacer 468 is a single layer or multi-layer stack structure formed of oxide, nitride or a combination thereof.

Source follower transistor 450 has a pyramid-shaped channel formed in semiconductor substrate 420 through which charge (e.g., electrons) flows, which increases transconductance Gm and operation speed of source follower transistor 450 without increasing pixel size. In particular, the gate trench 452 has a trapezoidal shape when viewed in the channel length plane of FIG. 4A, and a triangular shape, V-shape, or trapezoidal shape when viewed in any of the channel width planes of FIG. 4B—FIG. 4D. Representative methods of forming the gate trench 452 are described below.

As shown in FIG. 4A, the pyramid-shaped gate trench 452 has sloping end wall portions 456a, b. And, as shown in FIGS. 4B-4D, the gate trench 452 also has sloping side wall portions 454a, b. The end wall portions 456a, b and side wall portions 454a, b all come together at a downward pointing ridge 458, i.e., a ridge that points away from the gate 466. In the embodiment of FIGS. 4A-4D, the ridge 458 forms a line extending in the channel length direction. More generally, the ridge 458 is a narrow line or plane connecting the side wall portions and end wall portions, and represents the deepest depth of the gate trench 452. In some embodiments, the ridge is formed as a plane (e.g., a plateau) rather than a line, i.e., a plane connecting the side wall portions and end wall portions. See FIG. 5A.

As shown in FIG. 4B, the two side wall portions 454a, b form an interior angle α between 45 degrees and 100 degrees. In some embodiments, the interior angle α is acute e.g., from 55 degrees up to 75 degrees, or preferably 60 degrees to 70 degrees, which advantageously creates larger sidewalls, for greater effective channel width. In some embodiments, the interior angle α is obtuse (e.g., greater than 90 degrees, up to 100 degrees), which advantageously reduces transistor depth.

Returning to FIG. 4A, source 460 and drain 462 are each formed underneath the gate trench 452 through ion implantation, for example implanted through the gate trench 452. In particular, source 460 is formed underneath a source end of the gate trench 452 along the sidewalls of gate trench 452 associated with the source end of the gate trench 452, and drain 462 is formed underneath a drain end thereof along the sidewalls of gate trench 452 associated with the drain end of the gate trench 452. Because source 460 and drain 462 are each formed underneath the pyramid-shaped gate trench 452. Source 460 has a portion underneath end wall portion 456b, a portion underneath both side wall portions 454a, b, and a portion underneath ridge 458. See FIGS. 4A-4B. This gives source 460 a distinct triangular shape, V-shape, or trapezoidal shape when viewed in a channel width plane (e.g., the channel width plane of FIG. 4B).

Similarly, drain 462 includes end wall portion 456a, a portion of both side wall portions 454a, b, and a portion of the ridge 458. See FIGS. 4A-4D. This gives drain 462 the same V-shape, triangular shape, or trapezoidal shape in the channel width plane as source 460. Consequently, source 460 and drain 462 both have a triangular or V-shape that conforms to the shape of the gate trench 452. In particular, because source 460 and drain 462 are both aligned along ridge 458, both are aligned by the gate trench 452 itself, and thus aligned with each other. This alignment facilitates charge carrier mobility and increases operation speed.

Turning to FIG. 4C, gate 466 has a shape conformal to the gate trench 452. In other words, gate 466 has gate surfaces extending into the gate trench 452 and forming a V-shape complementary to the side wall portions 454 a, b of the gate trench 452. Restated, the gate surfaces and the gate 452 together form a triangular shaped portion, V-shaped portion, or trapezoidal shaped portion when viewed in a channel width plane. This shape advantageously forms a gate on an opposite side of the isolation layer 464 from side wall portions 454a, b.

As a result of the foregoing structure, buried channel portions 470 are formed in the semiconductor substrate 420 beneath the gate trench 452 along the sidewalls 454a, b. When a threshold voltage is applied to the gate 466, charge carriers move through buried channel portions 470 between the source 460 and drain 462.

Still referring to FIG. 4C, the foregoing structure creates a channel having a V-shape, a triangular shape, or a trapezoidal shape when viewed in the channel width plane. In other words, the channel has two sloped channels extending through the semiconductor substrate 420 along each of the side wall portions 454a, b between source 460 and drain 462. Each sloped channel has an effective channel width w' approximately equal to a length of the corresponding side wall portion. The effective width w' is a function of the gate trench depth d, planar channel width w, and internal angle α (and thus etch time, chemistry, substrate material, and etch area). In some embodiments, gate trench depth d is between 300 nm and 800 nm, inclusive. In some embodiments, planar channel width w is between 200 nm and 800 nm. As described above, the interior angle α can be between 45 degrees and 100 degrees, inclusive. Accordingly, the effective channel width w' of each sloped channel ranges from 300 nm to 800 nm, inclusive.

Accordingly, the overall channel has an effective channel width in the channel width plane equal to 2w'. In the illustrated embodiment where side wall portions 454a, b form approximately an interior angle α ranging from 55-70 degrees, e.g., preferably 60-70 degrees, the effective channel width is approximately 40% greater than the planar channel width w. This enables a significant increase in Gm without any increase in the width of the pixel 410.

The dimensions, angles, and proportions shown in FIGS. 4A-4D are representative, not limiting. For example, it is contemplated that some embodiments include a pyramid-shaped gate trench having a greater depth (i.e., forming a deeper "V" having greater effective channel widths w'). Such embodiments form an acute interior angle between the sidewalls. Similarly, it is contemplated that some embodiments include a pyramid-shaped gate trench with a shallower depth, such that the sidewalls form an obtuse interior angle.

Figure 5A:
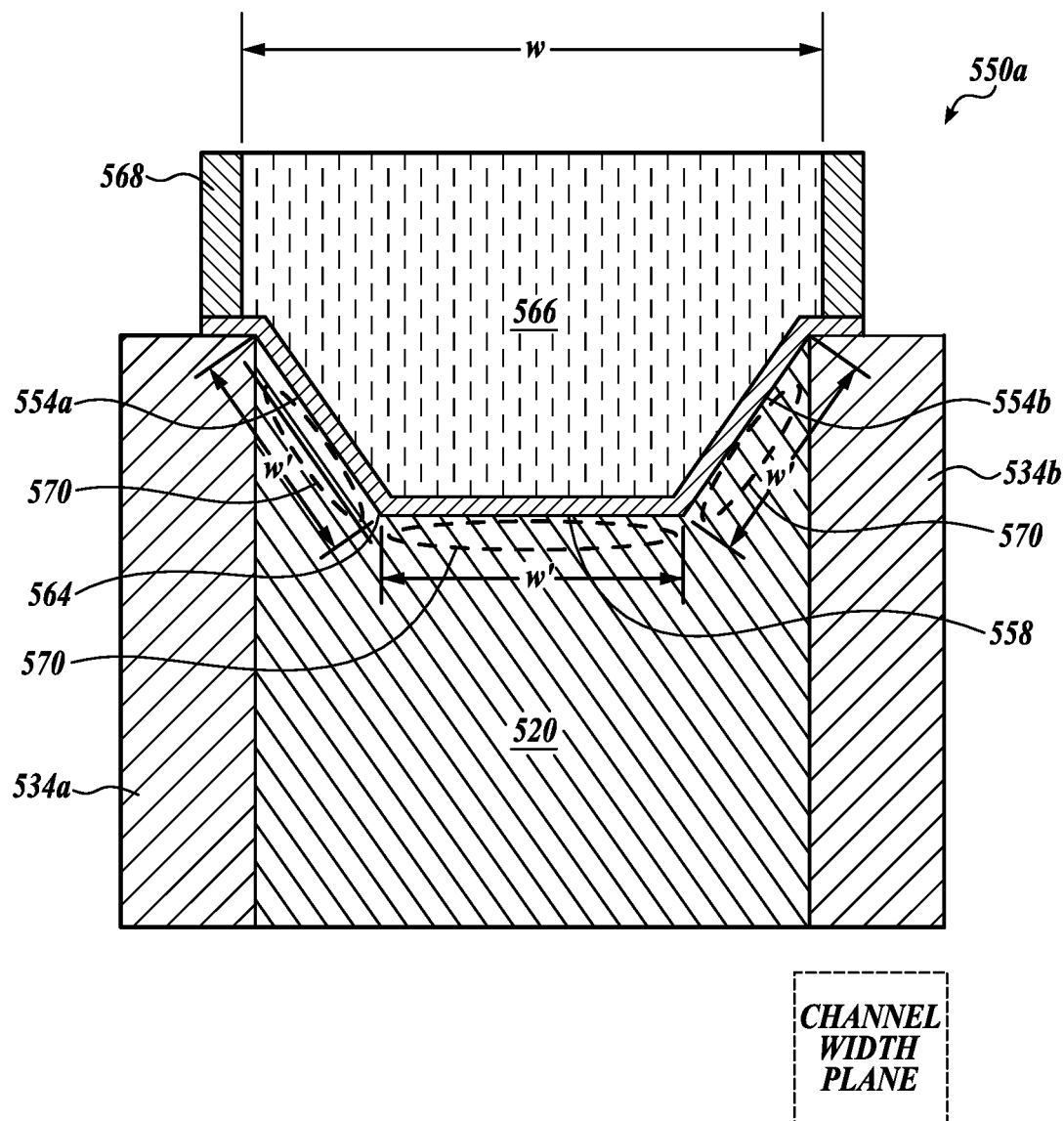
FIG. 5A shows a cross section of another embodiment of a source follower transistor in accordance with the teachings of the present disclosure.
Figure 5B:
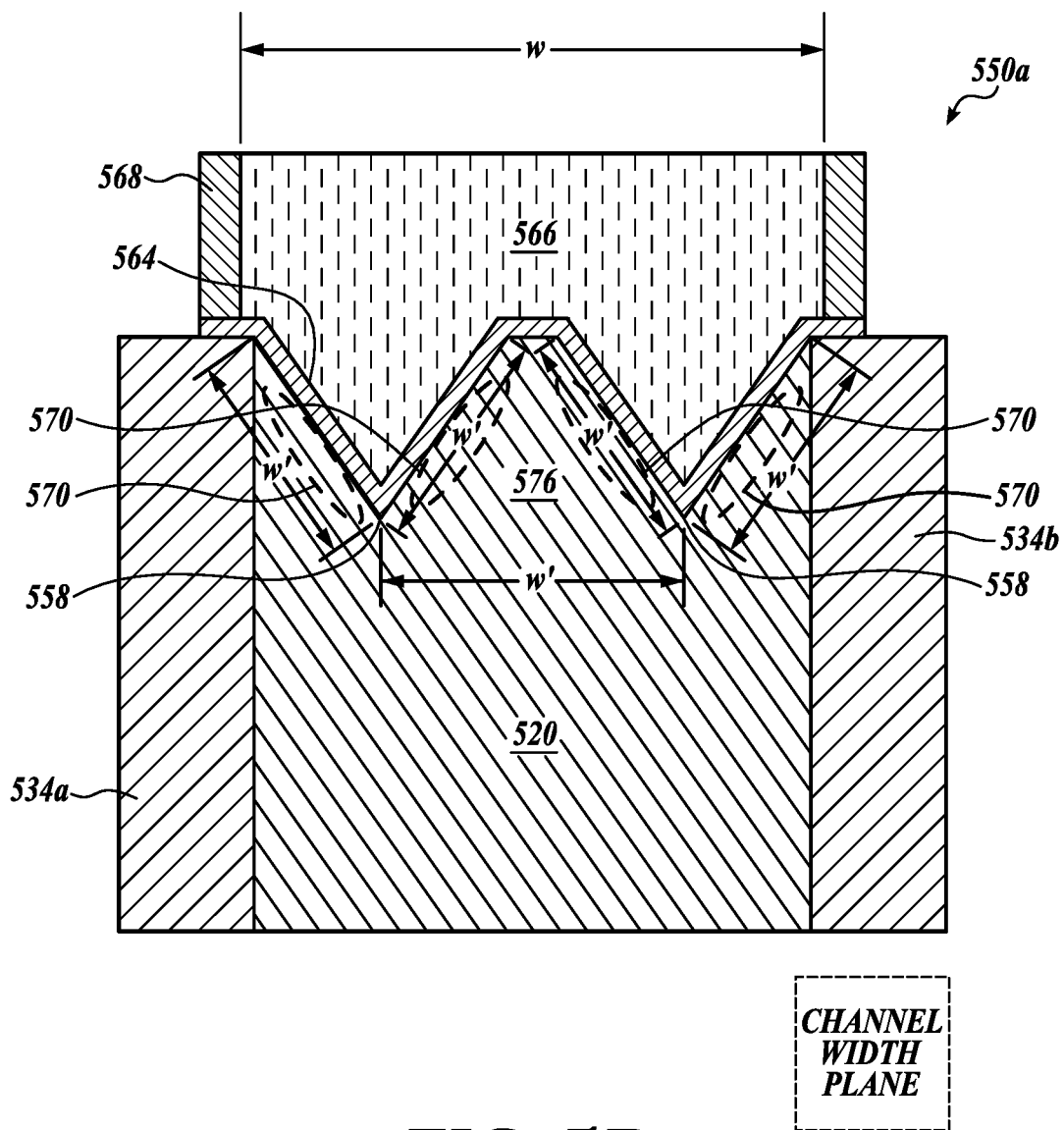
FIG. 5B shows a cross section of yet another embodiment of a source follower transistor in accordance with the teachings of the present disclosure.
Figure 5C:
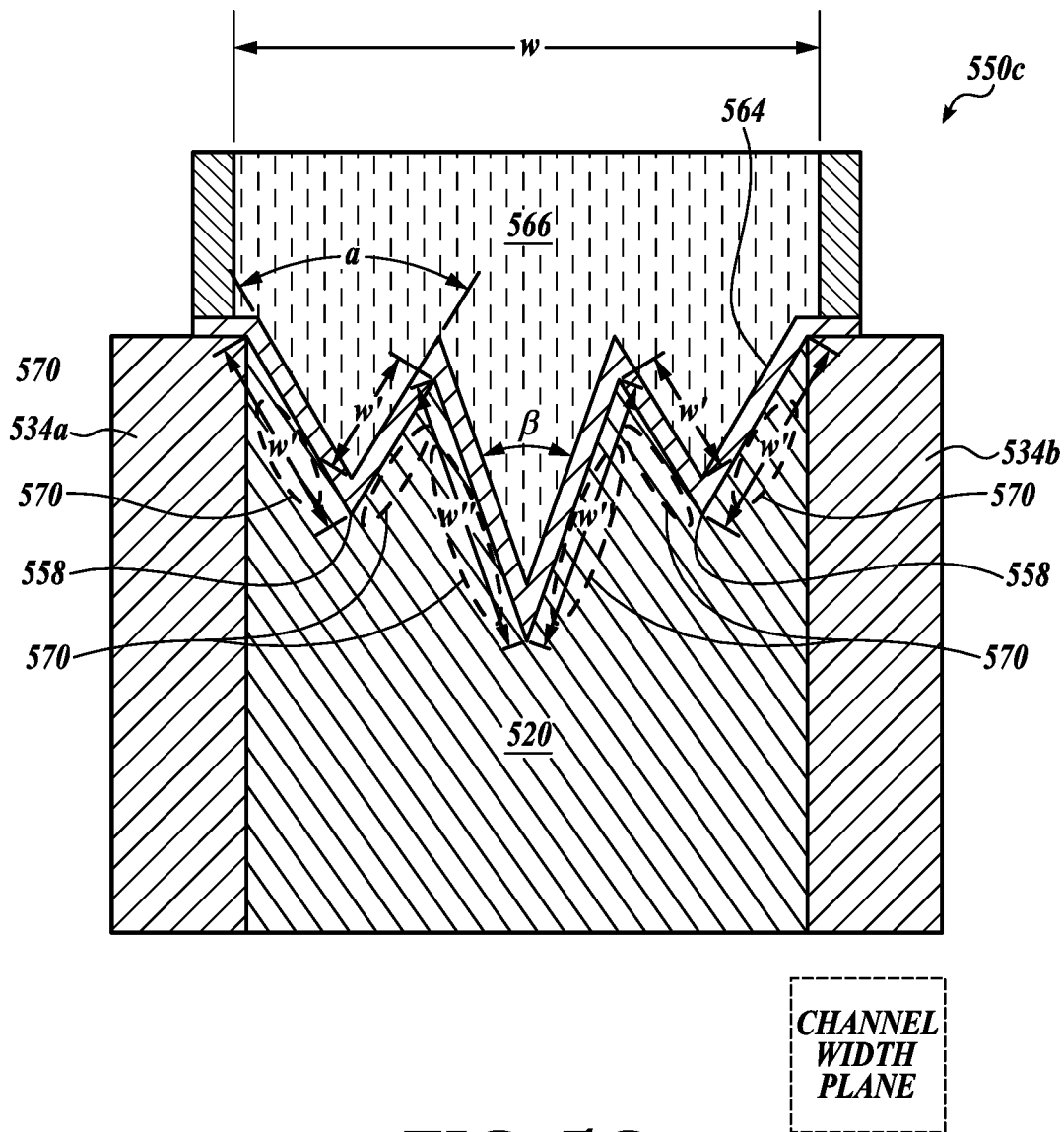
FIG. 5C shows a cross section of still another embodiment of a source follower transistor in accordance with the teachings of the present disclosure.

FIGS. 5A-5C show cross sections in a channel width plane of alternative source follower transistors 550a-c, which are similar to those described above with respect to FIGS. 3A-4D except as described below. Accordingly, the source follower transistors 550a-c can have any of the features of the transistors described above, and alike names and numerals are utilized to facilitate understanding. The cross sections of FIGS. 5A-5C are taken in a plane analogous to plane YY of FIGS. 3A-3B.

The source follower transistors 550a-c all have at least one pyramid-shaped gate trench formed in a semiconductor substrate 520. While the profiles in the channel width plane differ between the embodiments shown in FIGS. 5A-5C, all have the same trapezoidal profile in the channel length plane as the source follower transistor 450 shown in FIG. 4A.

An isolation layer 564 is formed upon the gate trench between a source and drain, and a gate 566 is disposed on the isolation layer 564 and extends into the gate trench. The source and drain are formed underneath the gate trench as described above and will not be described again. However, it shall be appreciated that the self-aligned source and drain facilitate charge carrier mobility in all of the embodiments of FIGS. 5A-5C. Optional channel isolation structures 534a, b and optional spacer 568 isolate the channel from other pixel elements. Channel isolation structures 534a, b have a depth that is deeper than the gate trench.

FIG. 5A shows a cross section of a source follower transistor 550a, wherein the pyramid-shaped gate trench has a trapezoidal shape in both a channel length plane and a channel width plane. Accordingly, the sloping side wall portions 554a, b come to a downward ridge 558 formed as a plateau (i.e., a flat horizontal plane). This structure provides sidewalls having a reduced width w' (i.e., reduced trench depth) as compared to the source follower transistor 450 of FIGS. 4A-4D. Accordingly, a channel is formed in buried channel portions 570, the channel having an effective channel width 3w' that exceeds the planar channel width w without increasing pixel width. Such a structure is advantageous in reduced-thickness applications. Such shorter sidewalls can be formed by controlling wet etch time according to a method described below.

FIG. 5B shows another source follower transistor 550*b*, which has two parallel and pyramid-shaped gate trenches. Accordingly, the two gate trenches define a nonplanar structure 576 having sloped side wall portions complementary to the gate trench. That is, each gate trench includes two sloping sidewalls which come to a ridge 558. The illustrated embodiment includes two pyramid-shaped gate trenches; however, this is representative. Other embodiments include three, four, or more pyramid-shaped gate trenches.

In the embodiment of 5B, the ridges 558 all extend to a common depth and have common interior angles in the illustrated embodiment. Advantageously, this enables economical fabrication with fewer steps.

End walls of each gate trench are like those shown in FIG. 4A. Accordingly, there are four total end walls (two for each gate trench). Advantageously, this structure results in buried channel portions 570 forming a channel when sufficient voltage is applied to the gate 566. This channel has an effective channel width 4w' that exceeds the planar channel width w without increasing pixel width. Such a structure can be formed according to a method that includes a plurality of wet etches, as described below.

FIG. 5C shows still another source follower transistor 550*c*, which has three parallel and pyramid-shaped gate trenches formed in the semiconductor substrate 520. That is, each gate trench includes two sloping sidewalls which come to ridge 558. End walls of each gate trench are like those shown in FIG. 4A. Accordingly, there are six total end walls (two for each gate trench).

Source follower transistor 550*c* has one gate trench with larger sidewall widths w" and a smaller interior angle β than other gate trenches, which have a sidewall width w' and interior angle α. This enables further engineering of the performance of the source follower transistor 550*c*. In some embodiments, a first plurality of gate trenches have a first sidewall width w' and interior angle α, and a second plurality of gate trenches have a different second sidewall width w" and interior angle β. The number of gate trenches shown above is representative, not limiting. Other embodiments include four, five, or more pyramid-shaped gate trenches, with at least one having different sidewall width w" and interior angle β.

Advantageously, this structure results in buried channel portions 570 forming a channel having an effective channel width 4w'+2w" that exceeds the planar channel width w without increasing pixel width. Such a structure can be formed according to a method that includes three wet etches, as described below.

Additional variations are possible, and the foregoing source followers are representative, not limiting. For example, any of the structures described above can be incorporated into a row select transistor, a reset transistor, or other transistor.

The transistors of the present disclosure can be efficiently fabricated by the methods described below. Known transistors having nonplanar structures generally utilize dry etch processes, which are known to create poor channel surfaces. By comparison, the methods described below utilize wet etching, which produces higher-quality channel surfaces and reduces RTS, read noise, and other deleterious effects. Further, certain of the methods below may be carried out with a single mask, rather than a separate mask for buried channel and gate trench formation.

Terms utilized with respect to these representative methods and having common names with structural terms used to describe the representative image sensors, pixels, and transistors of FIG. 1-FIG. 5C have common meanings with those terms.

In some embodiments, the methods described below are utilized to form a source follower transistor and/or a row select transistor. In some embodiments, each of the steps below is executed in a first instance for a source follower transistor and in a second instance for a row select transistor (either at a same time or substantially the same time as the first instance), in order to form both transistors on a common substrate material.

Thus, the methods described below may be executed in a first instance for a source follower transistor and, substantially contemporaneously with the first instance, in a second instance for a row select transistor. The representative methods may include, or may be modified to include one or more steps to impart one or more properties (e.g., dimensions) to structural elements, in accordance with the description of those elements provided above.

Figure 6:
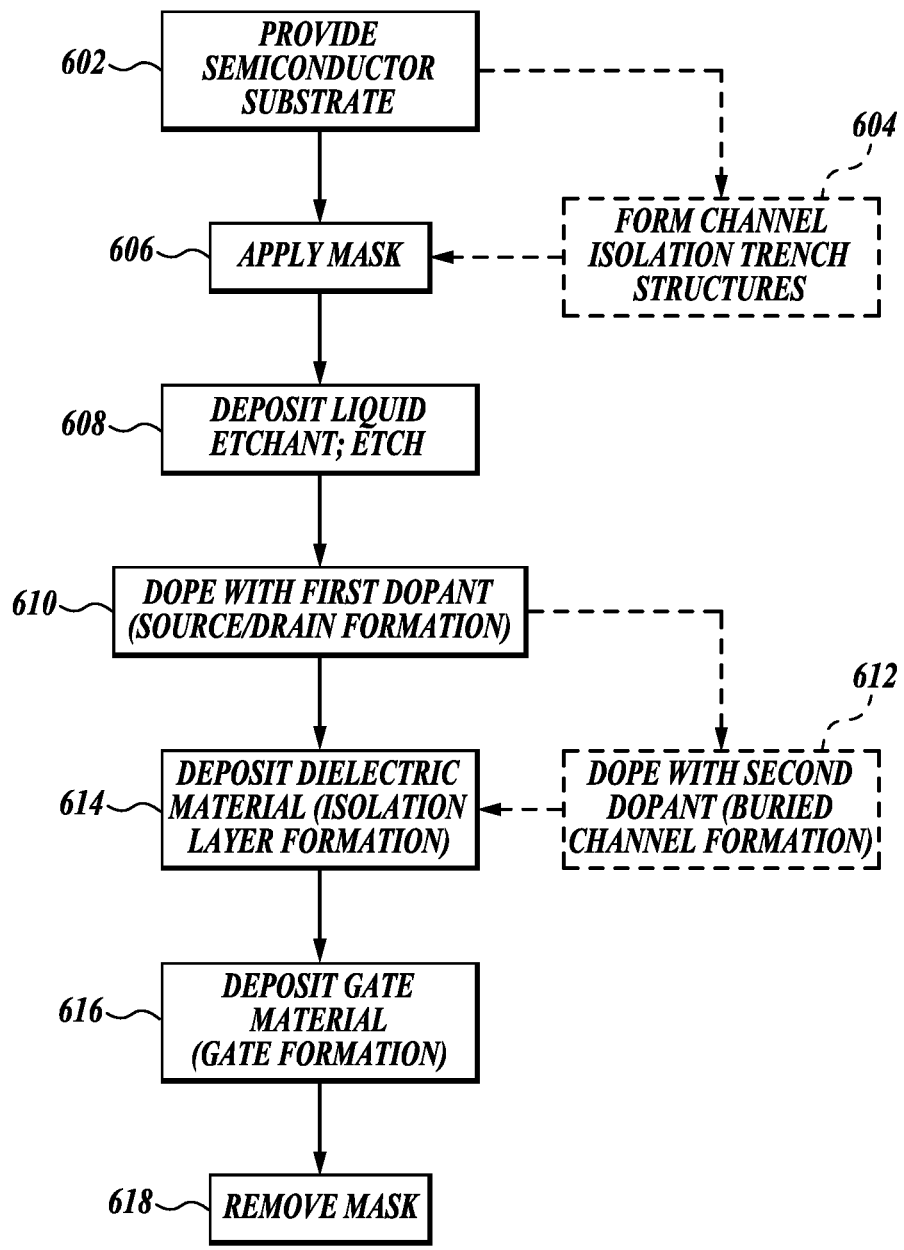
FIG. 6 shows a method of manufacturing a transistor in accordance with the teachings of the present disclosure.

Referring to FIG. 6, in a first step 602, a semiconductor substrate of a first conductive type (e.g., P-type) is provided. One or more photodiodes of a second conductive type (e.g., N-type) are formed in the semiconductor substrate.

In an optional step 604, one or more channel isolation structures (e.g., isolation trench structures) are formed in the semiconductor substrate, such as by providing a patterned channel isolation mask and dry or wet etching the semiconductor substrate to form shallow channel isolation structures on opposite sides of a device transistor area. A lithograph process, or similar, may be utilized to form the channel isolation mask, and any other mask(s) of the methods described herein to form trenches that extend a first depth in the semiconductor substrate. After forming the trenches, an isolation material (such as oxide material) is deposited into and filled each of the trenches in order to form the channel isolation structures. After forming the channel isolation structures, the mask is removed. In embodiments, optional step 604 can be processed prior to step 602.

In step 606, a mask (different from the channel isolation mask in optional step 604) is applied to the semiconductor substrate, defining at least one gate trench area. Step 606 is performed after optional step 604. In some representative methods, the mask used is the same mask as used to form a buried channel portion in the gate trench area. In some representative methods, the mask defines the gate trench area with at least one rectangular opening therethrough. For example, in some representative methods that form transistor structures such as shown in FIG. 5B-5C, the mask defines a plurality of rectangular openings therethrough; thus defining a plurality of gate trench areas.

In step 608, a liquid etchant is deposited on a top surface of the semiconductor substrate in the gate trench area(s) defined by the mask, in order to commence a wet etching process. In a representative embodiment, the wet etching process is an anisotropic process and the liquid etchant is $NH_4OH$, Tetramethylammonium Hydroxide, or a similar liquid etchant. The liquid etchant etches away the semiconductor substrate in both a channel width and channel length direction, thus with suitable etching time control, at least one pyramid-shaped gate trench having a plurality of sloping side wall portions and a plurality of sloping end wall portions coming together at a downward-facing ridge is formed at a second depth. In some embodiments, the second depth is the same as the first depth. In embodiments, the second depth is less than the first depth. Each pyramid-shaped gate trench has a triangular shape, V-shape, or trapezoidal shape in a channel width plane, and a trapezoidal shape in a channel length.

In some embodiments, sufficient etch time is permitted to pass such that the ridge forms a point or line, i.e., a very narrow portion of the semiconductor substrate having a deepest depth of the gate trench and extending along a channel length direction. By comparison, in some embodiments, etch time is restricted such that the ridge forms a plateau (a plane), rather than a point or line.

In step 610, a source is formed in the gate trench by implanting dopants of the second conductive type (e.g., an N-type dopant) through the gate trench at a source end of the gate trench forming a source region underneath the gate trench. In some embodiments, the source region is doped with N-type dopant such as arsenic, phosphorous. Likewise, a drain is formed in the gate trench by in-situ implanting dopants of the second conductive type through the gate trench at a drain end of the gate trench forming a drain region underneath the gate trench. The source and drain can be formed by diffusion, ion implantation, or other process.

In an optional step 612, a buried channel portion of the semiconductor substrate is implanted through the gate trench a depth into the semiconductor substrate with a dopant of the second conductive type (e.g., an N-type), such as arsenic or phosphorous. The buried channel portion is formed after depositing the liquid etchant and before depositing the dielectric material (described below). The buried channel portion is located between the source and the drain, and beneath the gate trench. The buried channel portion is formed such that it has a complementary shape to gate trench, i.e., a V-shape, triangle-shape, trapezoidal shape, or otherwise pyramid shape in a channel width plane. That is, doping the buried channel portion comprises doping side wall portions of the gate trench.

In step 614, a dielectric material (e.g., an oxide or high-K material) is deposited in the gate trench between the source and drain, thus forming a gate isolation layer. The gate isolation layer has a shape that conforms to the pyramid-shape gate trench.

In step 616, a gate material (e.g., a polysilicon or metal) is deposited upon the gate isolation layer.

In step 618, the mask is removed by a photoresist strip and clean process.

Thus, the present disclosure provides transistors, pixels, image sensors, other electronic devices, and processes for manufacturing the same. Advantageously, the transistors of the present disclosure, e.g., source follower transistors, row select transistors, reset transistors, and other transistors, have pyramid-shaped gate structures that increase Gm and operation speed without increasing pixel width.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

Modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

The present application may also reference quantities and numbers. Unless specifically stated, such quantities and numbers are not to be considered restrictive, but representative of the possible quantities or numbers associated with the present application. Ranges of quantities described and claimed herein shall be interpreted as inclusive of the low and high values stated. Also in this regard, the present application may use the term "plurality" to reference a quantity or number. In this regard, the term "plurality" is meant to be any number that is more than one, for example, two, three, four, five, etc. The terms "about," "approximately," "substantially," etc., means plus or minus 5% of the stated value. The term "based upon" means "based at least partially upon."

What is claimed is:

1. A transistor formed in a semiconductor substrate, comprising:
    a gate trench formed in the semiconductor substrate, wherein the gate trench includes a plurality of side wall portions converging at a ridge;
    a source formed underneath the gate trench;
    a drain formed underneath the gate trench;
    an isolation layer disposed on the gate trench between the source and the drain; and
    a gate disposed on the isolation layer,
    wherein the plurality of side wall portions, the ridge, and a top surface of the semiconductor substrate define a V-shape or a trapezoidal shape in a channel width plane extending through the gate and perpendicular to the ridge, wherein the source and the drain are aligned by the gate trench.

2. The transistor of claim 1, wherein the gate trench is further defined by a plurality of end wall portions which each form an obtuse angle with opposite ends of the ridge.

3. The transistor of claim 2, wherein the ridge is a line or a plane formed in the semiconductor substrate.

4. The transistor of claim 3, wherein the ridge and the plurality of side walls together point away from the gate.

5. The transistor of claim 2, wherein the plurality of side portions, the ridge, and the top surface of the semiconductor substrate together form a first shape in the channel width plane, and wherein the plurality of end wall portions, the ridge, and the top surface of the semiconductor substrate together form a different second shape in a channel length plane extending through the gate and parallel to the ridge.

6. The transistor of claim 1, wherein the transistor is a source follower transistor, a row select transistor, or a reset transistor.

7. The transistor of claim 1, wherein each of the source and the drain have a shape that conforms to the plurality of side wall portions of the gate trench.

8. The transistor of claim 1, wherein the source and the drain are aligned by the ridge.

9. The transistor of claim 1, wherein in the channel width plane, the gate has a plurality of gate surfaces forming a second V-shape complementary to the plurality of side wall portions of the gate trench.

10. The transistor of claim 1, wherein the gate trench is a first gate trench of a plurality of gate trenches formed in the semiconductor substrate in the channel width plane.

11. The transistor of claim 10, wherein the plurality of gate trenches comprises at least two gate trenches including the first gate trench.

12. The transistor of claim 11, wherein the plurality of gate trenches comprises at least three gate trenches including the first gate trench.

13. The transistor of claim 11, wherein the plurality of gate trenches define, in the channel width plane, at least one nonplanar structure of the semiconductor substrate.

14. The transistor of claim 13, wherein a first gate trench of the plurality of gate trenches extends to a first depth in the semiconductor substrate, and wherein a second gate trench of the plurality of gate trenches extends to a different second depth in the semiconductor substrate.

15. The transistor of claim 13, wherein each gate trench of the plurality of gate trenches extends to a common depth in the semiconductor substrate.

16. The transistor of claim 1, wherein the channel comprises a doped portion of the semiconductor substrate buried beneath the gate trench.

17. The transistor of claim 1, further comprising a plurality of channel isolation structures formed in the semiconductor substrate on opposite sides of the gate trench, wherein each of the plurality of channel isolation structures extends to a first depth into the semiconductor substrate that is greater than a second depth of the gate trench.

18. An image sensor, comprising:
- a transistor formed in a semiconductor substrate, the transistor comprising:
  - a gate trench formed in the semiconductor substrate, wherein the gate trench includes a plurality of side wall portions converging at a ridge;
  - a source formed underneath the gate trench;
  - a drain formed underneath the gate trench;
  - an isolation layer disposed on the gate trench between the source and the drain; and
  - a gate disposed on the isolation layer,
  - wherein the plurality of side wall portions, the ridge, and a top surface of the semiconductor substrate define a V-shape or a trapezoidal shape in a channel width plane extending through the gate and perpendicular to the ridge;
- a photodiode formed in the semiconductor substrate and operatively coupled with the transistor; and
- a transfer gate coupled to the photodiode and configured to transfer charge carriers from the photodiode to a floating diffusion, wherein the transfer gate and the gate trench have different depths in the semiconductor substrate;
- wherein at least a part of the gate is formed above the photodiode.

19. A method of forming a transistor, comprising:
- providing a semiconductor substrate having a first conductive type;
- applying a mask to a top surface of the semiconductor substrate, the mask defining a gate trench area of the semiconductor substrate;
- depositing a liquid etchant into the gate trench area defined by the mask and etching the semiconductor substrate, with the liquid etchant deposited into the gate trench area, until a gate trench is formed having a plurality of side walls converging at a ridge and forming a V-shape or a trapezoidal shape in a channel width plane extending perpendicular to the ridge;
- doping a source end and a drain end of the semiconductor substrate through opposite ends of the gate trench area, using a source/drain dopant such that the source end and drain end have a second conductive type;
- depositing a dielectric material upon the gate trench formed in the semiconductor substrate, such that the dielectric material extends from the source end to the drain end;
- depositing a gate material on the dielectric material; and
- removing the mask from the semiconductor substrate,
- wherein etching the semiconductor substrate comprises etching, with the liquid etchant deposited into the gate trench area, until at least a second gate trench is formed, the second gate trench having a plurality of second side wall portions converging at a second ridge.

20. The method of claim 19, wherein depositing the liquid etchant into the gate trench area defined by the mask includes etching the semiconductor substrate, with the liquid etchant deposited into the gate trench area, until a plurality of end wall portions are formed at opposite ends of the ridge, wherein each end wall portion forms an obtuse angle with the ridge.

* * * * *